United States Patent [19]

Fan et al.

[11] Patent Number: 4,942,066

[45] Date of Patent: Jul. 17, 1990

[54] SOLID IMAGING METHOD USING PHOTOHARDENABLE MATERIALS OF SELF LIMITING THICKNESS

[75] Inventors: Roxy N. Fan, East Brunswick, N.J.; Mario Grossa, Dreieich, Fed. Rep. of Germany

[73] Assignee: E. I. Du Pont de Nemours and Company, Wilmington, Del.

[21] Appl. No.: 341,612

[22] Filed: Apr. 21, 1989

[51] Int. Cl.⁵ ............................................. B05D 3/06
[52] U.S. Cl. .................................................. 427/54.1
[58] Field of Search ................... 427/54.1, 53.1, 407.1; 264/22, 25

[56] References Cited

U.S. PATENT DOCUMENTS

| | | | |
|---|---|---|---|
| 3,701,748 | 10/1972 | Kroekel | 260/40 |
| 4,005,244 | 1/1977 | Wismer et al. | 428/480 |
| 4,078,229 | 3/1978 | Swainson et al. | 340/173 CM |
| 4,288,861 | 9/1981 | Swainson et al. | 365/127 |
| 4,443,392 | 4/1984 | Becker et al. | 264/25 |
| 4,446,080 | 5/1984 | Karino et al. | 261/39 D |
| 4,571,316 | 2/1986 | Napuse et al. | 264/22 |
| 4,575,330 | 3/1986 | Hull | 425/174.4 |
| 4,752,498 | 6/1988 | Fudim | 427/54.1 |
| 4,842,782 | 6/1989 | Pontrez et al. | 264/25 |

FOREIGN PATENT DOCUMENTS 250121 6/1987 European Pat. Off. .
1276196 10/1969 United Kingdom .

OTHER PUBLICATIONS

Kodama, Hideo; Rev. Sci. Instrum. 52(11), 1770–1773, Nov. 1981.
Herbert, Alan J.; Journal of Applied Photographic Engineering, 8(4), 185–188, Aug. 1982.

Primary Examiner—Stanley Silverman

[57] ABSTRACT

An integral three-dimensional object is formed from a photohardenable liquid composition containing radiation deflecting matter whereby a difference in an index of refraction increases by more than 0.01 after photohardening.

7 Claims, 1 Drawing Sheet

SOLID IMAGING METHOD USING PHOTOHARDENABLE MATERIALS OF SELF LIMITING THICKNESS

FIELD OF THE INVENTION

This invention relates to production of three-dimensional objects by photohardening, and more particularly to a method utilizing photohardenable materials characterized by self limiting the depth of photohardening during irradiation.

BACKGROUND OF THE INVENTION

Many systems for production of three-dimensional modeling by photohardening have been proposed. European Patent Application No. 250,121 filed by Scitex Corp. Ltd. on June 6, 1987, provides a good summary of documents pertinent to this art area, including various approaches attributed to Hull, Kodama, and Herbert. Additional background is described in U.S. Pat. No. 4,752,498 issued to Fudim on June 21, 1988.

These approaches relate to the formation of solid sectors of three-dimensional objects in steps by sequential irradiation of areas or volumes sought to be solidified. Various masking techniques are described as well as the use of direct laser writing, i.e., exposing a photohardenable polymer with a laser beam according to a desired pattern and building a three-dimensional model layer by layer.

However, all these approaches fail to identify practical ways of utilizing the advantages of vector scanning combined with means to maintain constant exposure and attain substantially constant final thickness of all hardened portions on each layer throughout the body of the rigid three dimensional object. Furthermore, they fail to recognize very important interrelations within specific ranges of operation, which govern the process and the apparatus parameters in order to render them practical and useful. Such ranges are those of constant exposure levels dependent on the photohardening response of the material, those of minimum distance traveled by the beam at maximum acceleration dependent on the resolution and depth of photohardening, as well as those of maximum beam intensity depend on the photospeed of the photohardenable composition.

The Scitex patent, for example, suggests the use of photomasks or raster scanning for achieving uniform exposure, but does not suggest a solution for keeping the exposure constant in the case of vector scanning. The use of photomasks renders such techniques excessively time consuming and expensive. Raster scanning is also undesirable compared to vector scanning for a number of reasons, including:

necessity to scan the whole field even if the object to be produced is only a very small part of the total volume, considerably increased amount of data to be stored in most cases, overall more difficult manipulation of the stored data, and the necessity to convert CAD-based vector data to raster data.

On the other hand, in the case of vector scanning only the areas corresponding to the shape of the rigid object have to be scanned, the amount of data to be stored is smaller the data can be manipulated more easily, and "more than 90% of the CAD based machines generate and utilize vector data" (Lasers & Optronics, January 1989, Vol. 8, No. 1, pg. 56). The main reason why laser vector scanning has not been utilized extensively so far is the fact that, despite its advantages, it introduces problems related to the inertia of the optical members, such as mirrors, of the available deflection systems for the currently most convenient actinic radiation sources, such as lasers. Since these systems are electromechanical in nature, there is a finite acceleration involved in reaching any beam velocity. This unavoidable non-uniformity in velocity results in unacceptable thickness variations. Especially in the case of portions of layers having no immediate previous levels of exposure at the high intensity it becomes necessary to use high beam velocities, and therefore, longer acceleration times, which in turn result in thickness non-uniformity. The use of low intensity lasers does not provide a good solution since it makes production of a solid object excessively time consuming. In addition, the usefulness of vector scanning is further minimized unless at least the aforementioned depth and exposure level relationships are observed as evidenced under the Detailed Description of this invention.

No special attention has been paid so far to the composition itself by related art in the field of solid imaging, except in very general terms.

Thus, the compositions usually employed, present a number of different problems, a major one of which is excessive photohardening depthwise usually accompanied by inadequate photohardening widthwise. This problem becomes especially severe in cantilevered or other areas of the rigid object, which areas are not immediately over a substrate.

Therefore, it is an object of this invention to resolve the problem cited above by utilizing compositions, the opacity of which increases with exposure to actinic radiation. This is achieved by introducing into the photohardenable composition particulate radiation deflecting matter, such that the difference between the index of refraction of the composition and that of the deflecting matter increases upon irradiation.

U.S. Pat. No. 3,701,748 (Kroekel) describes a composition curable under heat and pressure for molding, containing a thermoplastic polymer which is soluble in the composition, but yields an optically heterogeneous cured composition.

British Patent No. 1,276,198 describes similar compositions as U.S. Pat. No. 3,701,748.

U.S. Pat. Nos. 4,078,229, 4,288,861, and 4,446,080 (Swainson et al.) describe holographic techniques utilizing two or more beams for multiple proton absorption for production of physical or refractive index inhomogeneities at the intersection of the beams.

European Patent Application No. 250,121 (Scitex Corp., Ltd.) discloses a three dimensional modelling apparatus using a solidifiable liquid which includes radiation transparent particles in order to reduce shrinkage.

SUMMARY OF THE INVENTION

The instant invention is directed to methods for direct production of three-dimensional photohardened solid objects, layer by layer using actinic radiation, preferably in a beam form such as provided by lasers for direct writing, by utilizing compositions, the opacity of which increases with exposure to actinic radiation and limits the depth of photohardening. This is achieved by introducing into the photohardenable composition particulate radiation deflecting matter, such that the difference between the index of refraction of the composition and that of the deflecting matter increases upon irradiation.

This invention may be summarized as follows:

A method for accurately fabricating an integral three dimensional object from successive layers of a photohardenable liquid composition comprising the steps of:

(a) forming a layer of a photohardenable liquid;

(b) photohardening at least a portion of the layer of photohardenable liquid by exposure to actinic radiation;

(c) introducing a new layer of photohardenable liquid onto the layer previously exposed to actinic radiation;

(d) photohardening at least a portion of the new liquid layer by exposure to actinic radiation, with the requirement that the photohardenable composition comprises an ethylenically unsaturated monomer, a photoinitiator, and radiation deflecting matter, wherein the deflecting matter has a first index of refraction, and the rest of the composition has a second index of refraction, and wherein the difference between the first index of refraction and the second index of refraction increases by more than 0.01 upon subjecting the composition to the radiation of the beam in order to selectively photoharden it.

BRIEF DESCRIPTION OF THE DRAWING

The reader's understanding of practical implementation of preferred embodiments of the invention will be enhanced by reference to the following detailed description taken in conjunction with perusal of the drawing figure, wherein.

DETAILED DESCRIPTION OF THE INVENTION

Figure 1:
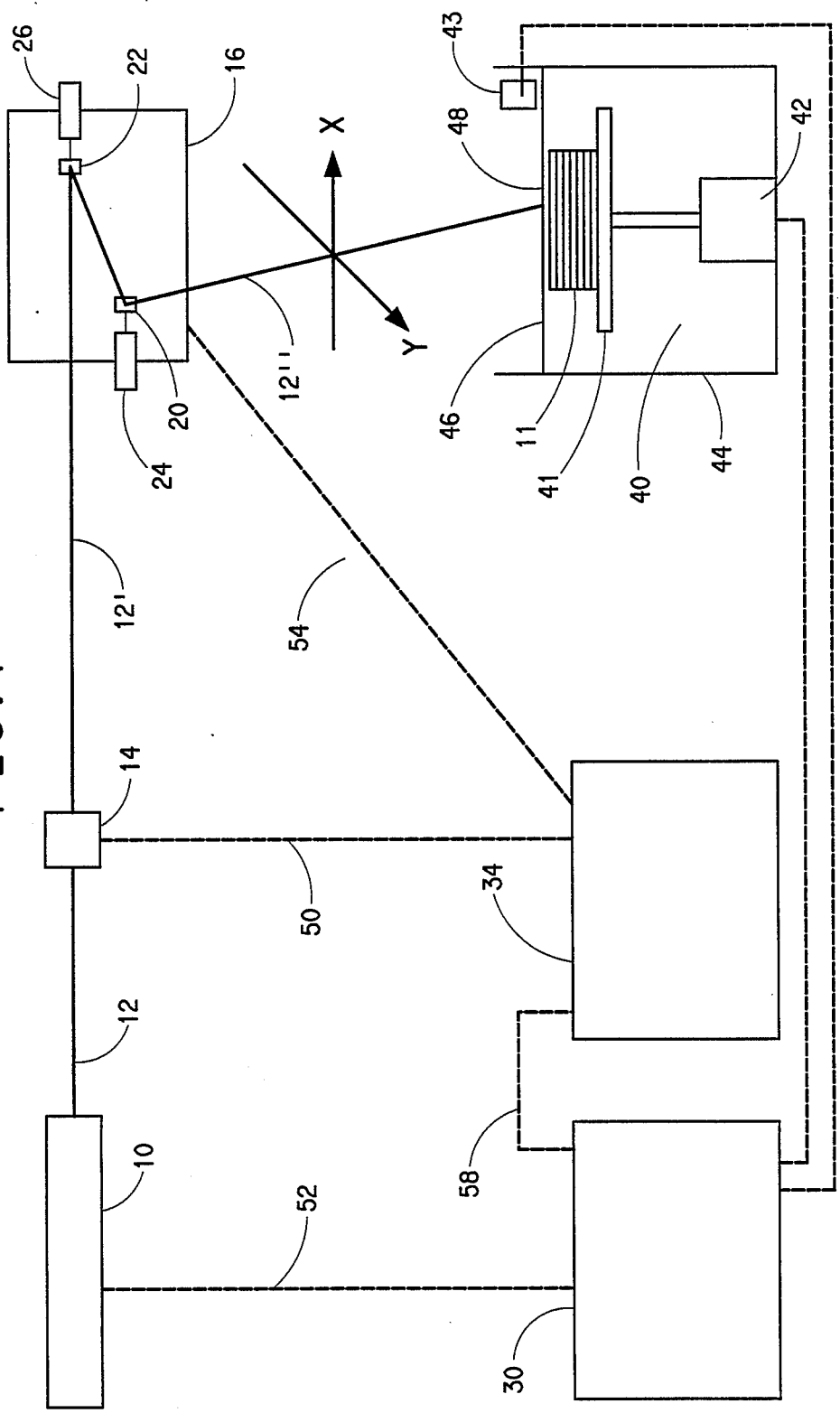
FIG. 1 is a block diagram of an apparatus used to perform the preferred embodiment of the process of the instant invention.

The instant invention is directed to compositions and methods for direct production of three-dimensional photohardened solid objects, layer by layer using actinic radiation, preferably in a beam form such as provided by lasers for direct writing, by utilizing compositions, the opacity of which increases with exposure to actinic radiation and limits the depth of photohardening. This is achieved by introducing into the photohardenable composition particulate radiation deflecting matter, such that the difference between the index of refraction of the composition and that of the deflecting matter increases upon irradiation.

As aforementioned, many systems for production of three-dimensional modeling by photohardening have been proposed. European Patent Application No. 250,121 filed by Scitex Corp. Ltd. on June 6, 1987, provides a good summary of documents pertinent to this art area, including various approaches attributed to Hull, Kodama, and Herbert. Additional background is described in U.S. Pat. No. 4,752,498 issued to Fudim on June 21, 1988.

In a preferred embodiment, an apparatus for practicing the present invention is depicted in FIG. 1, in the form of a block diagram. The apparatus and its operation are described below.

Actinic radiation means 10 shown in FIG. 1, which is preferably a high power laser, is used to provide an actinic radiation beam 12 having a certain intensity. The radiation beam 12 is passed through a modulator 14, where its intensity may be modulated. The modulated beam 12' is passed in turn through deflection means 16 such as a vector scanner in the form of a two-mirror 20 and 22 assembly, each mirror separately driven by a different motor 24 and 26 respectively. By causing mirror 20 driven by motor 24 to turn, the beam is deflected in an X direction, while by causing mirror 22 to turn, the beam is deflected in a Y direction, X direction being perpendicular to the Y direction. The actinic radiation beam 12" is thus controllably deflected towards preselected portions of the photohardenable composition which is contained in vessel 44 and presents a surface 46. It photohardens a thin layer 48 closest to the surface 46 of a photohardenable composition 40, to a depth of photohardening which equals the maximum thickness of the layer 48. The composite movement of the beam is preferably a vector type movement, and the beam is said to move or be scanned in a vector mode. Due to the inertia of the electromechanical deflection means 16, the velocity of the beam 12" on the thin layer 48 is also limited by the inertia and the electromechanical nature of the deflection means 16.

The deflection of the two mirrors 20 and 22 through motors 24 and 26 respectively is controlled by the second computer control means 34, while the graphic data corresponding to the shape of the solid object under production are stored in the first computer control means 30.

The second computer control means 34 is coupled with the modulation means 14, the deflection means 16 and the first computer control means 30, through control/feedback lines 50, 54, and 58, respectively. The graphic data stored in computer control means 30 aere fed to computer control means 34, and after being processed cause motors 24 and 26 to turn and move mirrors 20 and 22 accordingly in order to deflect the beam towards predetermined positions on the thin layer 48. Electrical feedback regarding the relative movements of the mirrors 20 and 22 is provided by the deflection means to the second computer control means 34 through line 54.

The manner of introducing successive layers of photohardenable liquid and exposing to actinic radiation such as a laser will generally be by two methods. In a first method a pool of liquid is present in a vessel and it is not necessary to introduce additional photohardenable liquid. In such case a movable table or floor supports the liquid. Initially the table or floor is elevated with a portion of the photohardenable liquid present above the table or floor and a portion of the liquid present in the vessel around the edge of the table or floor and/or underneath it. (Illustratively a table is present which allows liquid to flow underneath the table as it is used.) After exposure and photohardening of a portion of the liquid layer above the table, the table is lowered to allow another layer of photohardenable liquid to flow on top of the previous layer followed by exposure of predetermined area on the newly applied liquid layer. If necessary due to the shape of the final three dimensional article the thickness of more than one liquid layer can be photohardened. This procedure of table or floor lowering and exposure continues until formation of the desired three dimensional article occurs.

In a second method a movable table or floor need not be employed but rather a new quantity of photohardenable liquid is introduced into a vessel after an exposure step in formation of a new liquid layer on a previously exposed layer containing both photohardened material and photohardenable liquid. Criticality is not present in the manner of liquid introduction but rather in an ability to photoharden successive liquid layers.

In FIG. 1, a movable table 41 is initially positioned within the photohardenable composition 40, a short predetermined distance from the surface 46, providing a thin layer 48 between the surface 46 and the table 41. The positioning of the table is provided by the placement means 42, which in turn is controlled by the first computer control means 30 according to the data stored therein. The graphic data corresponding to the first layer of the shape of the rigid object are fed from computer control means 30 to computer control means 34, where they are processed along with feedback data obtained from deflecting means 16, and are fed to modulator 14 for controlling the same, so that when the beam travels in a vector mode on predetermined portions of the thin layer 48, the exposure remains constant.

When the first layer of the rigid object is complete, the movable table 41 is lowered by a small predetermined distance by the placement means 42 through a command from first computer control means 30. Following a similar command from computer means 30, layer forming means, such as doctor knife 43 sweeps the surface 46 for leveling purposes. The same procedure is then followed for producing the second, third, and the following layers until the rigid object is completed.

In the discussions above and below, the actinic radiation, preferably in the form of a beam, is many times referred to as light, or it is given other connotations. This is done to make the discussion clearer in view of the particular example being described. Thus, it should not be taken as restricting the scope and limits of this invention. Nevertheless, the preferred actinic radiation is light, including ultraviolet (UV), visible, and infrared (IR) light. From these three wavelength regions of light, ultraviolet is even more preferred.

The formulation of the photohardenable compositions for solid imaging purposes is very important in order to receive the desirable effects and characteristics, regardless of whether the scanning is of the vector type, raster type, or any other type, and the discussion hereinafter is referred to in any type of scanning, unless otherwise stated. However, from the different types of scanning, the vector type is the preferred type of scanning.

A photohardenable composition for solid imaging should contain at least one photohardenable monomer or oligomer and at least one photoinitiator. For the purposes of this invention, the words monomer and oligomer have substantially the same meaning and they may be used interchangeably.

Examples of suitable monomers which can be used alone or in combination with other monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di(p-hydroxyphenyl)propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Particularly preferred monomers are ethoxylated trimethylolpropane triacrylate, ethylated pentaerythritol triacrylate, dipentaerythritol monohydroxypentaacrylate, 1,10-decanediol dimethylacrylate, di-(3-acryloxy-2-hydroxylpropyl)ether of bisphenol A oligomers, di-(3-methacryloxy-2-hydroxyl alkyl)ether of bisphenol A oligomers, urethane diacrylates and methacrylates and oligomers thereof, coprolactone acrylates and methacrylates, propoxylated neopentyl glycol diacrylate and methacrylate, and mixtures thereof.

Examples of photoinitiators which are useful in the present invention alone or in combination are described in U.S. Pat. No. 2,760,863 and include vicinal ketaldonyl alcohols such as benzoin, pivaloin, acyloin ethers, e.g., benzoin methyl and ethyl ethers, benzil dimethyl ketal; α-hydrocarbon-substituted aromatic acyloins, including α-methylbenzoin α-allylbenzoin, α-phenylbenzoin, 1-hydroxylcyclohexyl phenol ketone, diethoxyphenol acetophenone, 2-methyl-1-[4-(methylthio)-phenyl]-2-morpholino-propanone-1. Photoreducible dyes and reducing agents disclosed in U.S. Pat. Nos. 2,850,445, 2,875,047, 3,097,096, 3,074,974, 3,097,097 and 3,145,104, as well as dyes of the phenazine, oxazine, and quinone classes, Michler's ketone, benzophenone, acryloxy benzophenone, 2,4,5-triphenylimidazolyl dimers with hydrogen donors including leuco dyes and mixtures thereof as described in U.S. Pat. Nos. 3,427,161, 3,479,185 and 3,549,367 can be used as initiators. Also useful with photoinitiators are sensitizers disclosed in U.S. Pat No. 4,162,162. The photoinitiator or photoinitiator system is present in 0.05 to 10% by weight based on the total weight of the photohardenable composition. Other suitable photoinitiation systems which are thermally inactive but which generate free radicals upon exposure to actinic light at or below 185° C. include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tert-butylanthraquinone, octamethylanthraquinone, 1,4-naphthoquinone, 9,10-phenanthraquinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthacene-5,12-dione, and 1,2,3,4-tetrahydrobenz(a)anthracene-7,12-dione. Also, alpha amino aromatic ketones, halogenated compounds like trichloromethyl substituted cyclohexadienones and triazines or chlorinated acetophenone derivatives, thioxanthones in presence of tertiary amines, and titanocenes.

Although the preferred mechanism of photohardening is free radical polymerization, other mechanisms of photohardening apply also within the realm of this invention. Such other mechanisms include but are not limited to cationic polymerization, anionic polymerization, condensation polymerization, addition polymerization, and the like.

Other components may also be present in the photohardenable compositions, e.g., pigments, dyes, extenders, thermal inhibitors, interlayer and generally interfacial adhesion promoters, such as organosilane coupling agents, dispersants, surfactants, plasticizers, coating aids such as polyethylene oxides, etc. so long as the photohardenable compositions retain their essential properties.

In this discussion a clear distinction should be made between a photohardenable and a photohardened composition. The former refers to one which has not yet been subjected to irradiation, while the latter refers to one which has been photohardened by irradiation.

When the composition is clear to the radiation beam, the depth of photohardening is considerably larger than the width of photohardening, mainly because the beams utilized, such as laser beams, and the like, are well collimated and focused. Addition of inert particulate matter, which is transparent to the radiation in the environment of the composition, has certain well recognized advantages, such as reduction of shrinkage upon polymerization or photohardening in general, and often increase in photospeed due to the reduction of the amount of active composition, which is subject to shrinkage, per unit of volume.

The large depth of photohardening is not a very big problem in areas supported by a substrate, since the depth is determined primarily by the thickness of the liquid layer on top of the substrate. However, in cantilevered unsupported areas, where the thickness of the liquid is very large, it becomes a serious disadvantage, as the depth of photohardening is not controlled or limited any more by the substrate. This is actually the area where the differences between conventional two dimensional imaging and solid or three dimensional imaging manifest themselves as being most profound. This is particularly important when there are uncontrollable exposure variations, which may result in thickness variations, and poor resolution. Thus a way to control the thickness is needed.

In addition to the lack of control of the depth of photohardening, there is one more problem having to do with resolution considerations. Except in very limited occasions, it is highly desirable for the resolution or tolerances of a part to be comparable in all dimensions. It does not make much sense to have high resolution in one dimension and very poor resolution in another dimension since the final resolution is going to be necessarily considered as poor, except in rare occasions as mentioned above. In clear compositions, the depth to width ratio is high, and thus the resolution widthwise is accordingly higher than the resolution depthwise. As a matter of fact, the resolution is inversely proportional to the dimensional units, and therefore, if the depth to width ratio is for example 5, the width resolution will be five times better than the depth resolution, when other factors do not play an active role. Thus, high transparency of the composition becomes in general undesirable. Preferable regions of depth to width ratios are 7:1 to 1:1, and more preferable 3:1 to 1:1.

The task of reducing the transparency or in other words increasing the optical density of the photohardenable composition sounds as a rather straightforward one, and it is, if photospeed and other important parameters are not taken into account. For example, addition of a radiation absorbent in the composition will decrease the depth of photohardening without affecting considerably the width. Typical absorbents are dyes. The monomers or oligomers of the composition may also act as absorbants to different degrees. However, if a dye, or other absorbent is used, the part of the radiation which is absorbed by radiation which is absorbed by it will not be available to directly promote photohardening.

A separate phase of dispersed particulate solid matter, emulsified liquid matter, or even matter in the form of gas may be utilized to control the depth/width relation, under conditions, which involve refraction or reflection or scattering of light or any combination thereof, labelled as radiation deflection for the purposes of this discussion. Suitable conditions constitute for example a substantial difference between the refraction index of the radiation deflection matter and the rest of the photohardenable composition. If everything else is kept constant, as the content in separate phase of radiation deflecting matter is increased, so does the width in expense of the depth. Since the radiation is not absorbed by the deflection matter but just deflected, no considerable loss of radiation occurs, and therefore, there is no substantial loss of photospeed.

The instant invention is directed to methods for direct production of three-dimensional photohardened solid objects, layer by layer using actinic radiation, preferably in a beam form such as provided by lasers for direct writing, by utilizing compositions, the opacity of which increases with exposure to actinic radiation and limits the depth of photohardening. This is achieved by introducing into the photohardenable composition particulate radiation deflecting matter, such that the difference between the index of refraction of the composition and that of the deflecting matter increases upon irradiation.

Since the general rule is that upon photohardening, the refraction index increases, for a definite increase in the difference between the refraction indices of the radiation deflection matter and the rest of the photohardenable composition it would be preferable that the refraction index of the deflection matter, which can be a dispersed solid or an emulsified liquid as discussed earlier, is smaller than that of the rest of the photohardenable composition before photohardening occurs. Thus, for this mechanism to be effective, the refraction index of the radiation deflection matter should preferably be smaller than that of the rest of the photohardenable composition before the photohardening process takes place. Otherwise, upon irradiation, the composition would have to first become clear before becoming opaque again, and the change in refraction index would have to be considerably larger, both of which are undesirable. Since the relative increase of the difference between the two refractive indices upon photohardening is inversely proportional to the initial difference of the two indices, it is preferable that the values of the two indices are close to each other but still different in the photohardenable composition. They should be different even before irradiation of the photohardenable composition to prevent excessive beam penetration at the beginning. In any case, the refraction index of the deflection matter should be smaller than that of the rest of the photohardenable composition by 0.01–0.03, and preferably smaller than by 0.01–0.02. Also, the increase in refraction index difference before and after photohardening should be at least 0.01, preferably higher than 0.02, and even more preferably higher than 0.04.

In other words, for the purposes of this invention, the liquid photohardenable composition must contain an ethylenically unsaturated monomer, a photoinitiator, and radiation deflecting matter, wherein the deflecting matter has a first index of refraction, and the rest of the composition has a second index of refraction, and wherein the difference between the first index of refraction and the second index of refraction increases by more than 0.01 upon subjecting the composition to the radiation of the beam in order to selectively photoharden it. It is preferable that the first index of refraction is smaller than the second index of refraction.

Initially, if we call "particle" each individual unit of the separate phase of the dispersed or emulsified radiation deflection matter in the photohardenable composition as aforementioned, the maximum particle size, measured as the average particle diameter, should be smaller than the depth of photohardening, but not width necessarily. It is preferred that not only substantially all particles are smaller than the depth of photohardening, but also that at least 90% of the particles are smaller than half the depth of photohardening, and even more preferred that at least 90% of the particles are smaller than one tenth the depth of photohardening.

In order to be effective for their purpose, the majority of particles should also be preferably larger than approximately half the wavelength of the beam's radiation. At approximately half the wavelength, the scattering yield of the particles attains a maximum value, while it decreases rapidly as the size of the particles goes down. On the other hand, as the particle size increases over about half the wavelength of the radiation, the scattering yield also starts dropping, but at a lower pace. As the particle size increases even more, the phenomena of refraction and reflection start prevailing. In practice there are only limited situations where all particles have substantially the same size, in which case they are called monodisperse. Generally, there is a distribution of particle sizes providing a combination of many types of actinic-radiation deflection.

The preferred deflecting matter, which can be of organic or inorganic nature, includes but is not limited to:

particles consisting of linear or branched polymers in the form of homogeneous beads or of core/shell type structure of such chemical types as cellulose propionate, polyethylene, polypropylene, polyisobutylene Poly methyl methacrylate, copolymers of acrylonitrile and methyl methacrylate, polyamides, polyvinylidene fluoride, polyvinyl fluoride, and the like, as well as mixtures thereof;

particles of crosslinked polymers like poly trimethylol propane tri acrylate, poly trimethylol propane tri methacrylate, poly trimethylol propane ethoxylated triacrylate, poly hexamethylene glycol diacrylate, poly hexamethylene glycol dimethacrylate, and the like, as well as mixtures thereof;

particles consisting of inorganic materials which have a refractive index in the range of about 1.39 to 1.55, are insoluble in the photopolymerizable liquid and do not inhibit photopolymerization, like magnesium sulfate heptahydrate, lithium fluoride, sodium carbonate, monobasic potassium carbonate, and the like, as well as mixtures thereof.

The preferred content in radiation deflection matter, although dependent on many parameters, such as refraction index, particle size, particle size distribution, particle shape, and the like, should be in general in the region of 5–40% by volume of the total mixture with a mean diameter of particle of 0.5 to 5 micrometers.

A sulfur linked trimethylol propane triacrylate oligomer (Example 1) containing dispersed core/shell polymer demonstrates the phenomenon of increasing opacity (optical density) during the photohardening step, and of limiting the depth of photohardening to almost half that of the depth of photohardening in the case of a composition containing no dispersed core/shell polymer (Example 2).

The same sulfur linked trimethylol propane triacrylate oligomer (Example 3) containing dispersed crosslinked pure trimethylol propane triacrylate also demonstrates this phenomenon of increasing opacity (optical density) during the photohardening step, and limiting of the depth of photohardening to almost half that of the depth of photohardening in the case of a composition containing no dispersed trimethylol propane triacrylate polymer (Example 4). In contrast, pure trimethylol propane triacrylate monomer containing dispersed crosslinked pure trimethylol propane triacrylate (Example 5) does not give the self-limiting advantage in depth of photohardening when compared to the same composition containing no dispersed polymer (Example 6).

Examples of photohardenable compositions are given below for illustration purposes only, and should not be construed as restricting the scope or limits of this invention. Quantities are given by weight in grams.

EXAMPLE 1

The following ingredients were mixed:
Plex 6696: 91 g
RCP 1674: 5
Benzildimethylketal: 4

Plex 6696 is an oligomer sold by Roehm GmbH., Darmstadt, West Germany. It is represented by the formula

TMPTA [S-TMPTA]$_x$-S-TMPTA where TMPTA stands for trimethylol propane triacrylate, and S for sulfur. The refractive index of the oligomer is n=1.489.

RCP 1674 is a core/shell type polymer made by Du Pont, having a core of butyl acrylate, butylene glycol diacrylate, and allyl methacrylate, and a shell of methyl methacrylate. This polymer has a refraction index of n=1.477, and a core to shell weight ratio of 4:1. It was prepared as shown in Example 7.

A thick layer of photohardenable composition was exposed to a range of 0–100 mJ/cm² with a filtered (transmittance 360 nm) high pressure Hg lamp.

The thickness of the solid layer received at an exposure of 80 mJ/cm² was 0.7.

The difference in refraction indices was 0.012 before exposure, and 0.045 after exposure, as Polymerized Plex 6696 was found to have a refraction index n=1.522 in an independent experiment.

EXAMPLE 2

The following ingredients were mixed together:
Plex 6696: 96
Benzildimethylketal: 4

A thick layer of photohardenable composition was exposed to a range of 0–100 mJ/cm² with a filtered (transmittance 360 nm) high pressure Hg lamp.

The thickness of the solid layer received at an exposure of 80 mJ/cm² was 1.3.

EXAMPLE 3

The following ingredients were mixed:
Plex 6696: 94.7
Irgacure 651: 0.5
Crosslinked TMPTA: 4.8

Irgacure 651 is 2,2-dimethoxy 2-phenylacetophenone, and available from CIBA GEIGY.

The crosslinked TMPTA (trimethylol propane triacrylate) had a particle size of 1.61 micrometers population mean, and 4.52 micrometers volume mean.

A thick layer of this photohardenable composition was exposed to a range of 0–100 mJ/cm² with a filtered (transmittance 360 nm) high pressure Hg lamp.

The maximum thickness of the solid layer received was approximately 0.5 mm, and the threshold energy for incipient photopolymerization was 12 mJ/cm².

EXAMPLE 4

The following ingredients were mixed:
Plex 6696: 99.5
Irgacure 651: 0.5

A thick layer of this photohardenable composition was exposed to a range of 0–100 mJ/cm² with a filtered (transmittance 360 nm) high pressure Hg lamp.

The maximum thickness of the solid layer received was approximately 1.8 mm, and the threshold energy for incipient photopolymerization was 20 mJ/cm².

EXAMPLES 5 and 6

The following ingredients were mixed:

|  | 5 | 6 |
|---|---|---|
| TMPTA | 32 g | 32 g |
| Benzildimethylketal | 0.9 | 0.9 |
| Crosslinked TMPTA (diameter 1.61 micrometers) | 7 | — |

The two mixtures were exposed in a Petri dish through a circular mask from the bottom using the 360 nm part of a filtered high pressure Hg lamp. At an exposure of 120 mJ/cm², the thickness of the samples of Examples 5 and 6 were 0.95 and 1.00 mm, respectively.

EXAMPLE 7

A core-shell polymer was prepared as follows:
Core
2388 gm of deionized water and 37.5 gm of a 30% aqueous solution of sodium dodecyl sulfonate were charged to a four-neck five liter flask equipped with a mechanical stirrer, condenser, heating mantle, addition funnel, thermometer and nitrogen inlet. The contents of the flask were purged with nitrogen, at room temperature, for 30 minutes and then heated up to 80° C. At that temperature, ⅛ of a monomer charge consisting of 1046 gm of butyl acrylate (BA), 279 gm of allyl methacrylate (AMA) and 70 gm of 1,4 butylene glycol diacrylate (BGD) was added in one shot. This was followed immediately by one shot additions of 19 ml of a 7% solution of sodium hydrogen phosphate, and 20 ml of a 5% solution of ammonium persulfate (both solutions were aqueous). The heat was turned off and the reaction mixture was allowed to exotherm. When the exotherm peaked at 84° C., the remainder of the monomer charge was added over a 90 minute period with intermittent heating to maintain the reaction temperature between 80 and 85° C. When the monomer (total monomer charge 1345 grams) addition was finished, the reaction mixture was heated at 80°–85° C. for an additional 2.5 hours. The final product was a bluish emulsion with 35.1% solids and had a particle size of 0.097 micron. The ratio of the monomers in this case was BA/BGD/AMA=75/5/20.

Shell
2000 gm of the core emulsion, described above, was placed in a five liter flask equipped similarly to the one used for the core synthesis. The contents of the flask were purged with nitrogen, at room temperature, for 30 minutes. After the nitrogen purge, the flask was charged, with stirring, with a mixture consisting of 1.45 gm ammonium persulfate, 2.9 gm of a 30% aqueous solution of sodium dodecyl sulfonate, and 332 gm of deionized water, over a 30 minute period. The contents of the flask were then heated up to 85° C., and 179 gm of methyl methacrylate were added over 60 minutes. When all the monomer had been added, the reaction mixture was heated for an additional 2 hours. The final product was a bluish emulsion with 36.2% solids and a particle size of 0.107 micron. The core to shell ratio was substantially 4:1.

The bluish emulsion was placed in a freezer for 3 days and then it was thawed, filtered, washed with deionized water, and dried at room temperature for about 3 days. For large samples, such as in the case of semiworks or plant batches, spray drying techniques involving hot air of 100 to 150° C. may be used.

What is claimed is:

1. A method for accurately fabricating an integral three dimensional object from successive layers of a photohardenable liquid composition comprising the steps of:
    (a) forming a layer of a photohardenable liquid;
    (b) photohardening at least a portion of the layer of photohardenable liquid by exposure to actinic radiation;
    (c) introducing a new layer of photohardenable liquid onto the layer previously exposed to actinic radiation; and
    (d) photohardening at least a portion of the new liquid layer by exposure to actinic radiation, with the requirement that the photohardenable composition comprises an ethylenically unsaturated monomer, a photoinitiator, and radiation deflecting matter, wherein the deflection matter comprises dispersed particulate solid matter, emulsified liquid or gas, wherein substantially all deflecting matter is smaller than the depth of photohardening and wherein the deflecting matter has a first index of refraction, and the rest of the composition has a second index of refraction, and wherein the difference between the first index of refraction and the second index of refraction increases by more than 0.01 upon subjecting the composition to the radiation in order to selectively photoharden it.

2. The mehtod of claim 1 wherein steps (c) and (d) are successively repeated.

3. The method of claim 2, wherein the first index of refraction is smaller than the second index of refraction.

4. The process of claim 2, wherein the deflecting matter is an emulsified liquid.

5. The process of claim 2, wherein the deflecting matter is a dispersed solid.

6. The method of claim 2, wherein the actinic radiation is in the form of a beam.

7. The method of claim 6, wherein the radiation is in the region of light wavelength.

* * * * *